US007603263B2

(12) United States Patent
Yamaguchi et al.

(10) Patent No.: US 7,603,263 B2
(45) Date of Patent: Oct. 13, 2009

(54) SPATIAL SIMULATION PROGRAM AND SYSTEM

(75) Inventors: Satoshi Yamaguchi, Kokubunji (JP); Keiro Muro, Koganei (JP); Kazuaki Iwamura, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 392 days.

(21) Appl. No.: 11/356,183

(22) Filed: Feb. 17, 2006

(65) Prior Publication Data

US 2007/0032993 A1 Feb. 8, 2007

(30) Foreign Application Priority Data

Jul. 22, 2005 (JP) ............................. 2005-212458

(51) Int. Cl.
- G06G 7/50 (2006.01)
- G06F 19/00 (2006.01)
- G01V 3/00 (2006.01)
- G01W 1/00 (2006.01)

(52) U.S. Cl. .................. 703/9; 702/1; 702/2; 702/3; 706/928; 706/929; 706/930; 706/931

(58) Field of Classification Search ............... 703/9; 702/1, 2, 3; 706/928, 929, 930, 931
See application file for complete search history.

(56) References Cited

U.S. PATENT DOCUMENTS 5,480,305 A * 1/1996 Montag et al. ................ 434/2

5,598,359 A * 1/1997 Montag et al. ................ 703/6

OTHER PUBLICATIONS

Torrens, Paul. "How Cellular Models of Urban Systems Work": Centre for Advanced Spatial Analysis—Nov. 2000.*
Al-Sabhan et al. "A Real-Time Hydrological Model for Flood Prediction Using GIS and the WWW": Computers, Environment and Urban Systems 27—2003.*
Keane et al. "A Classification of Landscape Fire Succession Models: Spatial Simulations of Fire and Vegetation Dynamics", Ecological Modeling, 2004.*

(Continued)

*Primary Examiner*—Kamini S Shah
*Assistant Examiner*—Shambhavi Patel
(74) *Attorney, Agent, or Firm*—Antonelli, Terry, Stout & Kraus, LLP.

(57) ABSTRACT

It is possible to easily perform the spatial simulation for a large area. Provided is a computer-readable medium recorded with a spatial simulation program for controlling a computer to execute procedures for calculating a time-based change of a variable in a plurality of numerical grids to reproduce on a computer a time-based change of a phenomenon represented by the variable in a space represented by the plurality of numerical grids, the spatial simulation program including the procedures of: defining a sub domain composed of the plurality of numerical grids (201); setting a forcing condition for the sub domain (204); detecting the sub domain including the numerical grid in which the variable changes with time; detecting the sub domain including the numerical grid in which the variable referred to for calculating the time-based change is positioned (205); and updating variables in the numerical grids constituting the detected sub domain (208).

9 Claims, 16 Drawing Sheets

OTHER PUBLICATIONS

Clarke, et al. "A Self-Modifying Cellular Automaton Model of Historical Urbanization in the San Francisco Bay Area", Environment and Planning B: Planning and Design, 1997.*

The manual of riparian work economy investigation (plan) May 2000 (with Translation).

Domain Decomposition Methods—Algorithms and Theory, Springer Series in Comuputational Mathematics, vol. 34, Andrea Toselli, Olof Widlund, 2005, pp. 1-34.

* cited by examiner

SPATIAL DATA TABLE 132

| TYPE 410 | SUB DOMAIN ID 420 | STORAGE LOCATION OF SPATIAL DATA TO BE USED 430 |
|---|---|---|
| ELEVATION | (120, 130) | http://A.com/elev/120130.dat — 431 |
| ELEVATION | (120, 131) | C:\elev\120131.dat — 432 |
| ROUGHNESS | (120, 131) | C:\rough\120131.dat — 433 |

*FIG. 4*

UPDATE-REQUIRED TABLE

| SUB DOMAIN ID | SPATIAL DATA ACQUISITION STATUS |
|---|---|
| (120, 130) | ALREADY OBTAINED |
| (120, 131) | ALREADY OBTAINED |
| (120, 132) | NOT OBTAINED YET |

*FIG. 6*

| NAME | URL | COST INFORMATION |
|---|---|---|
| A COMPANY | http://A.com/ | 10,000 YEN /km$^2$ |
| B COMPANY | http://B.com/ | 12,000 YEN /km$^2$ |
| C COMPANY | http://C.com/ | 20,000 YEN /km$^2$ |

SPATIAL SIMULATION PROGRAM AND SYSTEM

CLAIM OF PRIORITY

The present application claims priority from Japanese application P2005-212458 filed on Jul. 22, 2005, the content of which is hereby incorporated by reference into this application.

BACKGROUND OF THE INVENTION

This invention relates to a simulation for reproducing an interesting phenomenon on a computer, in particular, a spatial simulation program and system for updating a variable in a numerical grid for each time step.

Recently, for the purpose of grasping an interesting phenomenon, a system for easily realizing a spatial simulation on a standard computer such as a PC (Personal Computer) has been a focus of attention. In general, in the spatial simulation, a real space is represented by a plurality of numerical grids, and a phenomenon to be simulated is represented by a variable. Furthermore, a time-based change in the phenomenon is represented by updating the variable for each certain duration (time step). For example, a flood simulation which is a kind of the spatial simulation is known, for example, as described in "Manual for economic survey of flood control (draft)", published by River Bureau, Ministry of Construction, May 1999, pages 26 to 36. The flood simulation represents flood by updating variables such as water depth, current velocity, etc.

The flood simulation supposes principally the case where a levee failure happens, and calculates a water depth in the flooded area. First, prior to the start of the simulation, an area to be simulated (target area) is determined. The area that does not correspond to the target area cannot be taken into consideration in the simulation. Next, the arrangement of numerical grids in the target area is determined. In order to allow the currently existing PC to execute a processing within a practical time, the number of numerical grids is required to be limited to 10,000 or less. Therefore, the numerical grid is formed as a square shape, about 250 m on a side. Finally, variables such as a water depth and a current velocity in the numerical grids arranged in the target area are updated for each time step.

SUMMARY OF THE INVENTION

However, in the conventional spatial simulation method as described above, it is necessary to first designate the target area, which makes it impossible to simulate an area that does not correspond to the target area. For example, in the case of a flood simulation for simulating a downstream area of one river as a target area, it is impossible to simulate an upstream area, a middlestream area, and the other flooded area of the river, which are not selected as the target area. Therefore, prior to the execution of the simulation, a user is required to estimate an area to be affected by the simulation to be executed. Moreover, in the method that is mentioned above, "Manual for economic survey of flood control (draft)", as the target area is enlarged, the amount of calculations increases correspondingly. In practice, the upper limit of the area of the target area is 500 $Km^2$. Thus, there is a problem in increasing the target area because it is difficult to readily calculate a spatial simulation for a larger target area with a standard computer.

This invention is made to solve the above problem. It is therefore an object of this invention to provide a program and a system for performing a spatial simulation at a high speed with a small amount of data so as to easily perform the spatial simulation for a large target area.

According to the present invention, there is provided a computer-readable medium recorded with a spatial simulation program for controlling a computer to execute procedures for calculating a time-based change of a variable in a plurality of numerical grids to reproduce on a computer a time-based change of a phenomenon represented by the variable in a space represented by the plurality of numerical grids, the spatial simulation program including the procedures of: defining a sub domain composed of the plurality of numerical grids; setting a forcing condition for the sub domain; detecting the sub domain including the numerical grid in which the variable changes with time; detecting the sub domain including the numerical grid in which the variable referred to for calculating the time-based change is positioned; updating the variables in the numerical grids constituting the detected sub domain.

Therefore, this invention enables the spatial simulation at a high speed with a small amount of data for a large target area. Furthermore, the amount of spatial data to be obtained can be reduced by obtaining spatial data of a sub domain at the time when a variable in the sub domain is required to be updated as compared with a method of estimating necessary spatial data prior to the execution of a simulation and obtaining the spatial data at a time. As a result, when, for example, the spatial data is fare-paying, the cost for executing the spatial simulation can be reduced.

BRIEF DESCRIPTION OF THE DRAWINGS

FIG. 4 is an explanatory view showing the contents of a spatial data table.

FIG. 6 is an explanatory view showing the contents of an update-required table.

FIG. 13 is a view showing an example of a GIS server table for storing information of a GIS server.

DESCRIPTION OF THE PREFERRED EMBODIMENTS

Hereinafter, an embodiment, in which a spatial simulation according to this invention is applied to a flood simulation, will be described based on the accompanying drawings.

Figure 1:
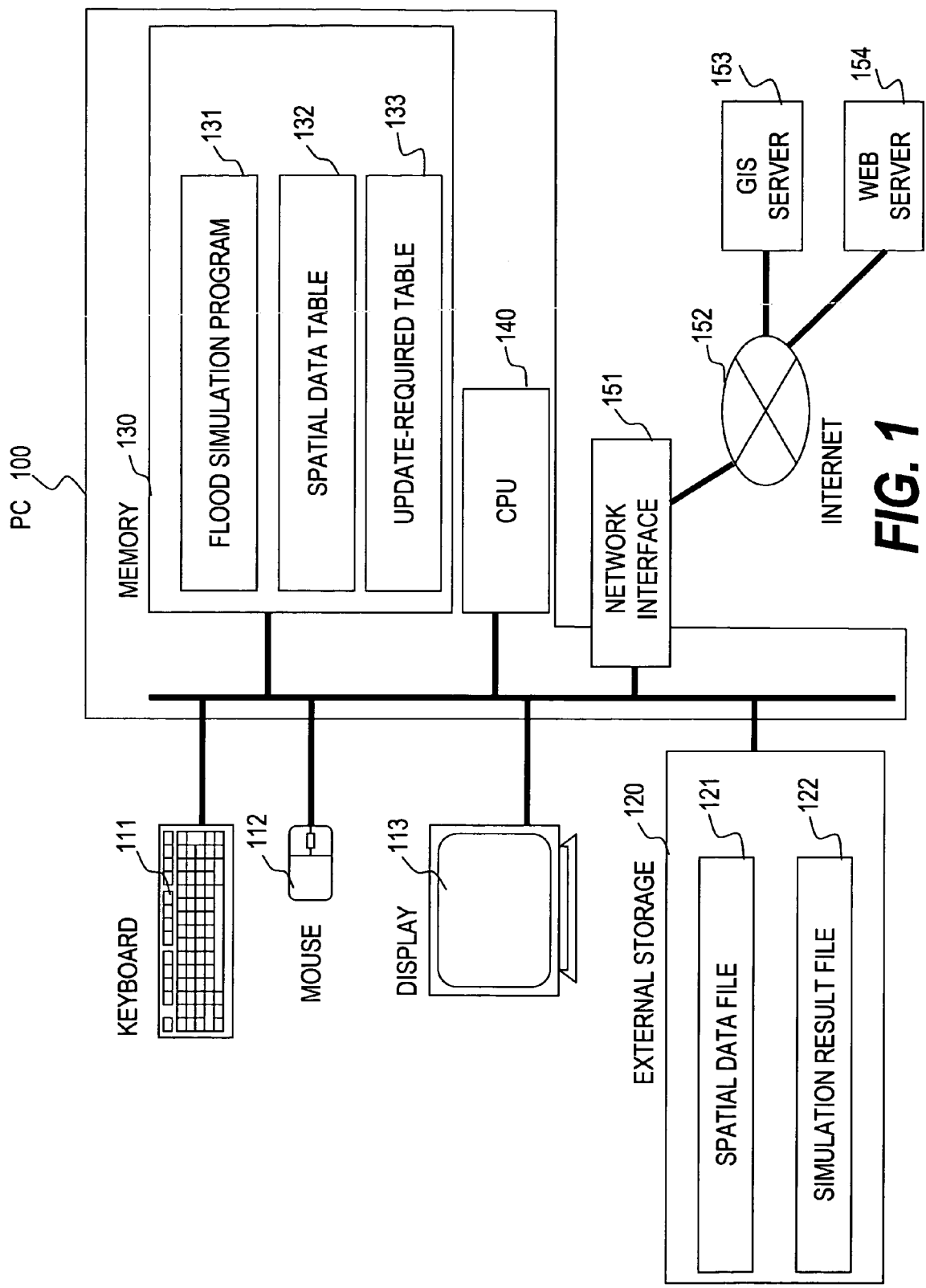
FIG. 1 is a block diagram of a computer system to which this invention is applied.

FIG. 1 is a schematic block diagram showing a configuration of a computer system for realizing a spatial simulation according to this invention.

A user of the spatial simulation inputs an instruction through an input unit such as a keyboard 111 or a mouse 112 connected to a PC (Personal Computer) 100. The result of the simulation is output to a display unit 113 so as to be confirmed. In the PC 100, a CPU (Central Processing Unit) 140 executes a flood simulation based on a flood simulation program 131 serving as a spatial simulation program loaded in a memory 130.

During the execution of the flood simulation program 131, a spatial data table 132 and an update-required table 133 are created and referred to in the memory 130. During the execution of the flood simulation program 131, the CPU 140 expands spatial data from a spatial data file (spatial data storage unit) 121, which is stored in an external storage (a storage system or the like) 120, into the memory 130 as needed. The CPU 140 also stores the result of flood simulation as a simulation result file 122 in the external storage 120. The spatial data is composed of, for example, geographic information or the like. An example of the geographic information is data composed of information for specifying a part of a space such as a vertex, a face, a line, or a solid, and a value related to the specified space, for example, station data or river data. The spatial data represents a space to be a target of the spatial simulation. For example, the spatial data represents an elevation, a ground roughness (a physical quantity affecting bottom friction), or the like.

Instead of the external storage 120, the spatial data may be obtained from a GIS (Geographic Information System) server 153 or a Web server 154 connected to the Internet 152 through a network interface 151. Moreover, the simulation result data may be stored in the server 153 or 154.

Figure 2:
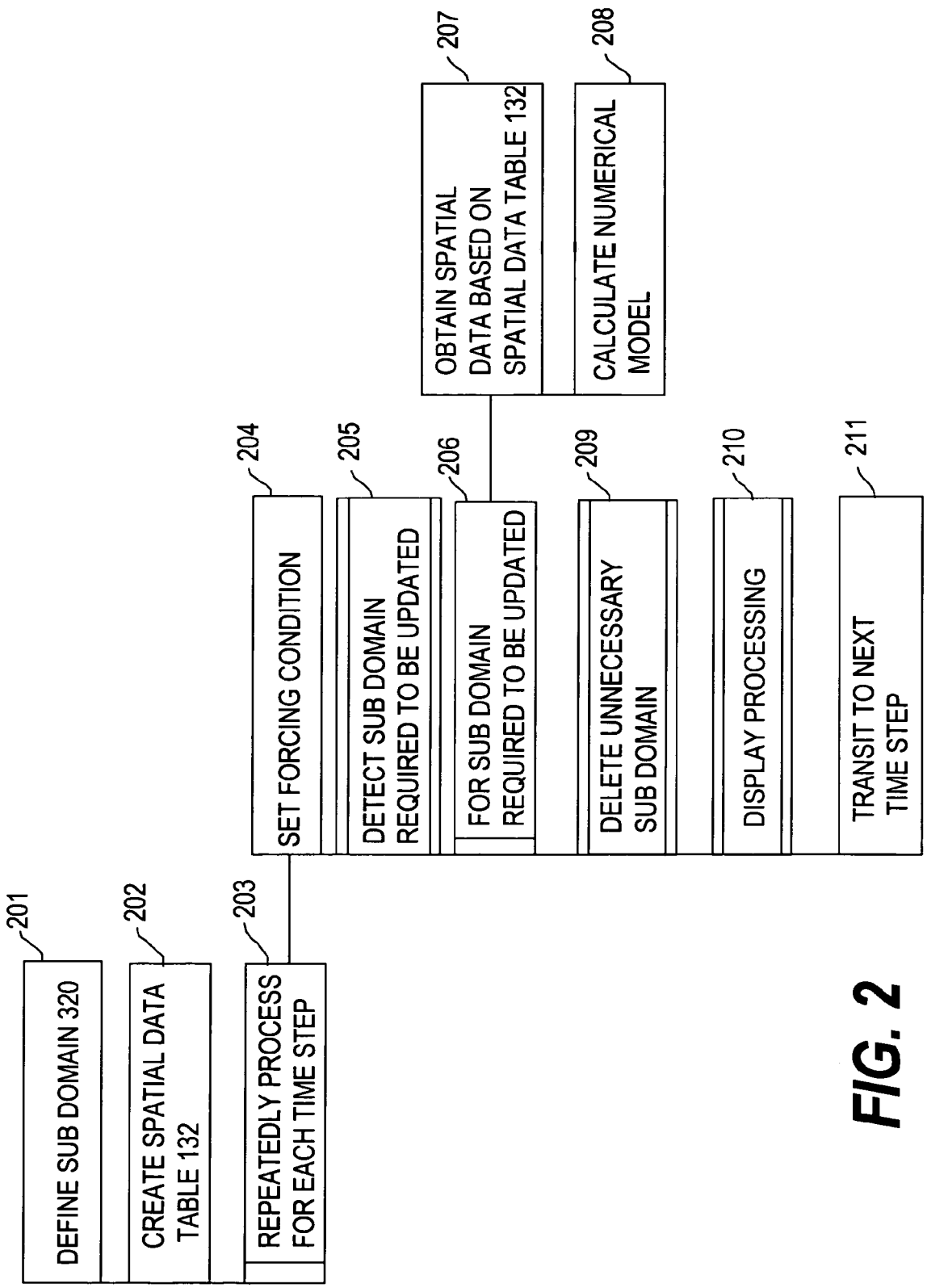
FIG. 2 is a PAD diagram showing an example of a processing of a flood simulation program.

FIG. 2 is a PAD diagram showing the schema of a processing of the flood simulation program 131, executed on the computer system shown in FIG. 1. The CPU 140 executes each of the steps of the program shown in FIG. 2.

Figure 3:
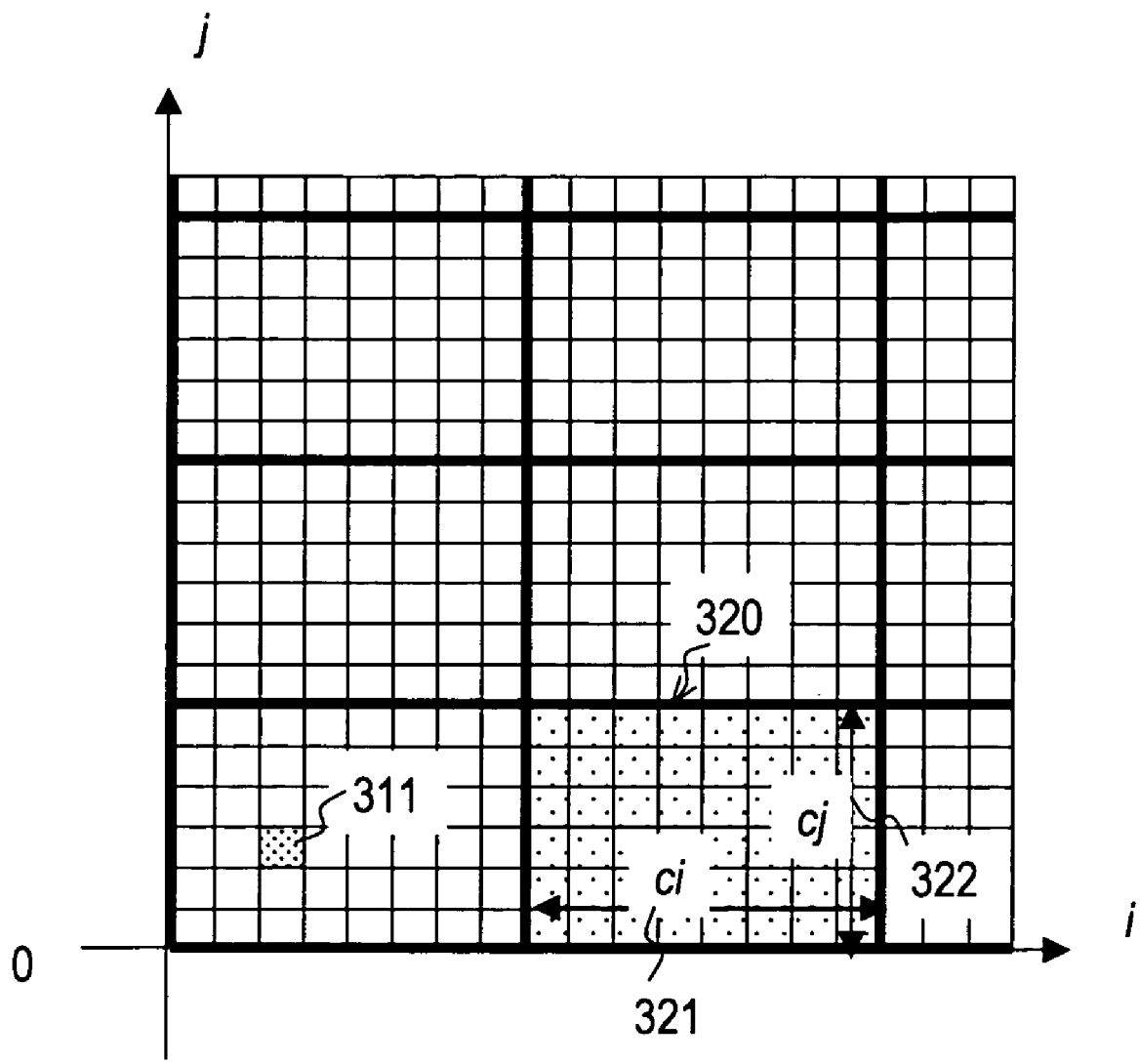
FIG. 3 is a graph showing the relation among a target area, sub domains, and numerical grids in a flood simulation.

First, in step 201 shown in FIG. 2, a sub domain is defined in a space to be subjected to a flood simulation. The sub domain is obtained by dividing a real space so as to have a predetermined shape. Furthermore, a plurality of numerical grids are arranged within the sub domain. FIG. 3 is a view schematically showing the relation among the real space, the numerical grids, and the sub domain. By using FIG. 3, three relations, in other words, the relation between the real space and the numerical grids, the relation between the numerical grids, and the sub domain, and the relation between the numerical grids and the variables will be described.

First, the relation between the real space and the numerical grids will be described. For example, a geographical information coordinate (x, y) with the east increasing through the x-axis and the north increasing through the y-axis is set in the real space. The coordinate (x, y) of a target point represents the distance from that target point to the origin point. A coordinate of the origin point is (0, 0). Subsequently, the numerical grids are arranged in the entire space represented by the geographical information coordinate (x, y). Each of the numerical grids is a rectangular area surrounded by a thin line, for example, that denoted by the reference numeral 311 shown in FIG. 3. The geographical information coordinate (x, y) is used to define a numerical grid coordinate (i, j) as follows.

$$i=\mathrm{floor}(x/dx), j=\mathrm{floor}(y/dy) \quad (1)$$

where dx and dy are the size of the numerical grid in the x-axis direction and the y-axis direction, respectively, and floor ( ) function returns the largest value that is not greater than the argument and is equal to a mathematical integer. The origin point of the numerical grid coordinate is the same as that of the geographical information coordinate. An i-axis and a j-axis are parallel to the x-axis and the y-axis, respectively. The coordinate (i, j) of the target point corresponds to the number of grids from the origin point to the target point.

Next, the relation between the numerical grids and the sub domain will be described. In FIG. 3, the sub domain is a rectangular area surrounded by a thick line, for example, that denoted by the reference numeral 320 shown in FIG. 3. One sub domain includes ci-numerical grids (321) in the i-axis direction and cj-numerical grids (322) in the j-axis direction shown in FIG. 3. Herein, each of ci and cj is an integer equal to or larger than 2. The numerical grid coordinate (i, j) is used to define a sub domain coordinate (bi, bj).

$$bi=\mathrm{floor}(i/ci), bj=\mathrm{floor}(j/cj) \quad (2)$$

The sub domain coordinate (bi, bj) allows the sub domain to be uniquely designated. In this embodiment, for example, dx=dy=50 m and ci=cj=50 can be set. Hereinafter, the description will be given based on these settings.

Finally, the relation between the numerical grid and the variable will be described. One or a plurality of types of variables are present in one numerical grid. The variable represents a phenomenon to be simulated. In this embodiment, three types of variables, in other words, a water depth h, a current velocity u in the x-axis direction, and a current velocity v in the y-axis direction are present in one numerical grid (i, j). These three types of variables represent a flood phenomenon. This embodiment will be described for the case of a collocated grid in which all the variables are present in the same grid. However, the following description will also apply to the case where a grid coordinate is offset by ½ for each variable, for example, as in the case of a staggered grid. This is apparent from the theory of DDM (Domain Decomposition Methods). The details thereof are described in the following article, "Domain Decomposition Methods—Algorithms and Theory", (Toselli, Andrea, Widlund, Olof, ISBN: 3-540-20696-5, Springer, 2005).

After setting the numerical grids and the sub domain as described above, the variables are allocated. The introduction of the notion of the sub domain composed of a plurality of numerical grids yields the following advantages. (A) The reduction of a calculation load. In steps 203, 206, and 209 described below, the sub domain is repeatedly processed. Therefore, the number of repeats is reduced to decrease the calculation load as compared with the case where the numerical grids are repeatedly processed. (B) Increased compatibility with the related art. By introducing the notion of the sub domain, the notion of the numerical grid is not required to be changed from that in the related art, for example, as described in "Manual for economic survey of flood control (draft)". As a result, the numerical model, for example, described in "Manual for economic survey of flood control (draft)" corresponding to the related art can be used without almost any modification as a numerical model processed in, for example, step 208 described below. (C) Increased in compatibility with the DDM. This invention has a common point with the related art DDM in that one area is divided into sub domains so as to obtain a result of simulation in that area. Therefore, the result of studies of the DDM can be used for problems common to this invention and the related art such as high-efficiency parallelization. (D) Compatibility with an SIMD (Single Instruction/Multiple Data) instruction. In many types of CPUs, a plurality of data can be processed by only one issuance of a CPU instruction called an SIMD instruction. When data to be processed is provided in a memory in consideration of the properties of the SIMD, with use of the SIMD instruction, a remarkably higher speed of the processing can be realized. For example, in a CPU including an SIMD operation unit having a register width of 128 bits, when the type of variable arranged in the numerical grid is a 32-bit width single precision floating-point number, with use of the SIMD instruction, the higher effect of increasing the speed of processing can be obtained if the number of numerical grids aligned in the memory is a multiple of 4. In order to realize such arrangement in this embodiment, each of the values ci and cj of the size of the sub domain is set to be a multiple of 4. In this manner, since the numerical grids are consecutively aligned in the memory when the sub domain is introduced, with use of the SIMD instruction, a higher speed of processing can be realized.

Furthermore, in order to increase the speed of calculation, it is possible to set a target area and its boundary or to set a boundary condition for a boundary between a sea area and a land area. The target area corresponds to an area where a flood phenomenon to be simulated occurs as described above. A flood phenomenon occurring in an area other than the target area is not to be simulated. When the target area is not particularly set or the entire area is set as the target area, the entire space represented by the geographical information coordinate (x, y) can be simulated as described above. When a small area is set as the target area, only the small area is simulated. Therefore, there is a possibility of reduction in the amount of calculations as compared with the case where the target area is not particularly designated or a larger area is set as the target area.

The boundary condition is preferably set for a boundary between the target area and its outer area. As the boundary condition, for example, any one of the following two conditions can be used. (1) It is supposed that a deep ditch is present at the boundary. In other words, water reaching the boundary line vanishes. (2) It is supposed that a high wall is present at the boundary. In other words, water reaching the boundary line remains in the vicinity of the boundary. Since water does not flow out of the boundary under any of the conditions, the calculation is always unnecessary outside of the boundary. A similar boundary condition can be set for the boundary between the sea area and the land area. In this embodiment, the target area is not particularly limited, and the boundary condition (1) is used for the boundary between the sea area and the land area.

Subsequently, in step 202, a spatial data table 132 is created. FIG. 4 is a view showing an example of the content of the spatial data table set in step 202.

A storage location of the spatial data obtained by the flood simulation program 131 is set for each sub domain in the spatial data table 132. Types 410 of the spatial data required in the flood simulation in this embodiment are an elevation, a ground roughness, and the like. Any ID can be used as a sub domain ID 420 as long as it can identify the sub domain. For example, the sub domain ID 420 is created from the sub domain coordinate (bi, bj) described above as shown in FIG. 4. The content that can be set as a location 430 where the data to be used is stored is the Web server 154 as denoted by the reference numeral 431 shown in FIG. 4, the spatial data file 121 in the external storage 120 as denoted by the reference numerals 432 and 433 shown in FIG. 4, or the like.

For the storage location 430, the storage location 430 may be uniquely calculated from the sub domain ID 420 by storing the storage location 430 under a regular file name based on the sub domain ID under a certain directory. In this case, instead of the spatial data table 132, a function is not created. The function provides the same information as the spatial data table provides, that is, the function gets the sub domain ID and returns the storage location of the spatial data. As a result, time and labor for creating the spatial data table 132 is saved. For example, as shown in FIG. 4, when the sub domain ID 420 is (120, 131), the storage location 430 of the corresponding elevation data is "C:\elev\120131.dat".

Instead of creating the spatial data table 132, the spatial data may be obtained from the GIS server 153 on the network or the like. In this case, in order to obtain the spatial data in step 202 or 207 described below, a data request describing the type and the position of the spatial data required for the GIS server 153 is issued. At this time, for enabling the designation of the position by a coordinate value used in the geographic information such as a longitude and a latitude, a method of mutually converting the numerical grid coordinate or the sub domain coordinate and the coordinate such as the longitude and the latitude is defined instead of creating the spatial data table 132. For the mutual conversion, for example, a UTM (Universal Transverse Mercator) coordinate which is a kind of coordinate used for, for example, representing the geographic information, may be used as the geographical information coordinate (x, y) described above. The UTM coordinate (x, y) can be mutually converted with the longitude-latitude coordinate. For mutual conversion between the UTM coordinate, the numerical grid coordinate, and the sub domain coordinate, the above-described formulae (1) and (2) are used to enable the mutual conversion between the longitude-latitude coordinate, the geographical information coordinate (x, y), the numerical grid coordinate (i, j), and the sub domain coordinate (bi, bj).

Furthermore, when multiple GIS servers 153 on the network or the like can be used, it is advantageous to prestore information of the GIS servers 153 in the external storage 120 or the like. FIG. 13 is a view showing an example of a GIS server table for storing the information of the GIS server. In this case, in step 202 or 207 described below, after the coordinate of the sub domain corresponding to a target is converted into the longitude-latitude coordinate, a data request is issued to a URL (Uniform Resource Locator) described in the GIS server table 1300. In addition to the URL, a user ID, a password, and the like can be added to the GIS server table 1300 as needed.

In addition to a GIS server name 1301 and a URL 1302, cost information 1303 such as a unit cost of data is predescribed in the GIS server table 1300 shown in FIG. 13. When the data is not free, the GIS server may be selected in accordance with the cost information 1303 or the like.

Next, in step 203, the steps after step 204 are repeatedly performed. In step 211 described below, for an elapsed time t (second) from the start of the simulation, a time step dt (second) is added by one repeated processing. The time step dt is a value set as a minimum unit time for performing the flood simulation. In this embodiment, for example, dt=5 seconds can be set.

A break condition in step 203 is set before a transition to step 203. For the break condition, for example, a use's input of an abort instruction through the keyboard 111 or the like is suitable. When such a break condition is set, the user can complete the simulation at an arbitrary point of time by the user's own independent judgment. Accordingly, the usability of the user is improved. Alternatively, a time point at which the elapsed time t from the start of the simulation exceeds the total time length T (second) or the number of repeats of step 203 exceeds a preset number of repeat times can be set as the break condition. When the total time length is set in this manner, the program can automatically judge a condition for completing the simulation to enable a batch processing. Moreover, a dialog 1100 described below can estimate a remaining time to the completion of the simulation.

In step 204, a forcing condition is set. The external force expresses a phenomenon causing a phenomenon to be a target of the spatial simulation, including a time-based change. As described below, the variable can be determined as indicating one of a state where a phenomenon occurs and a state where a phenomenon does not occur. Thus, the external force puts the variable into a state where a phenomenon occurs, and the external force changes with subsequent elapse of time to enable the update of the variable in accordance with the elapse of time. The external forces are treated as boundary conditions in a numerical model in step 208 described below.

As external forces in the flood simulation, for example, efflux from a river levee failure point, precipitation described in "Manual for economic survey of flood control (draft)", and the like can be cited. The efflux changes a water depth and a current velocity in the periphery of the river levee failure point, while the precipitation changes a water depth in a precipitation area. A formula for converting the forcing condition into a variable such as the water depth or the current velocity is described in "Manual for economic survey of flood control (draft)" described above. The flood simulation program 131 causes the user to input the type and the position of the external force. The input forcing conditions are assigned to the conversion formula described above to calculate the type, a value, and a numerical grid coordinate (i, j) of the variable to which the external force is input. For example, when supposing a external force that is a failure of a levee having a height of 1.0 m, which happens at the point 60.0 km east and 75.0 km north of the origin point, the water depth h=1.0 m is set in the numerical grid coordinate (i, j)=(12000, 15000).

In the subsequent step 205, the sub domain required to be updated, more precisely, the sub domain containing the numerical grid required to be updated is detected. The sub domain required to be updated is a sub domain in which the flood phenomenon occurs or a sub domain to which the flood phenomenon propagates from the periphery. The sub domain that is not required to be updated is a sub domain in which the flood phenomenon does not occur and to which the flood phenomenon does not propagate from the periphery. In step 205, the sub domain required to be updated is detected so that only the sub domain required to be updated can be handled in the subsequent steps 206 to 208. The judgment in step 205 is extremely important because an incorrect judgment may produce an unexpected result. For example, when it is erroneously judged that the sub domain is required to be updated although it is not actually required to be updated, unnecessary processings are performed in steps 206 to 208, thereby increasing a calculation load. On the other hand, when it is erroneously judged that the sub domain is not required to be updated although it is actually required to be updated, the obtained result of simulation contains an unexpected error. On the contrary, when a correct judgment is performed to limit the number of sub domains required to be updated to the minimum necessary, a correct simulation result can be obtained with a smaller calculation load than that in the conventional method. The judgment method will be described below.

Figure 5:
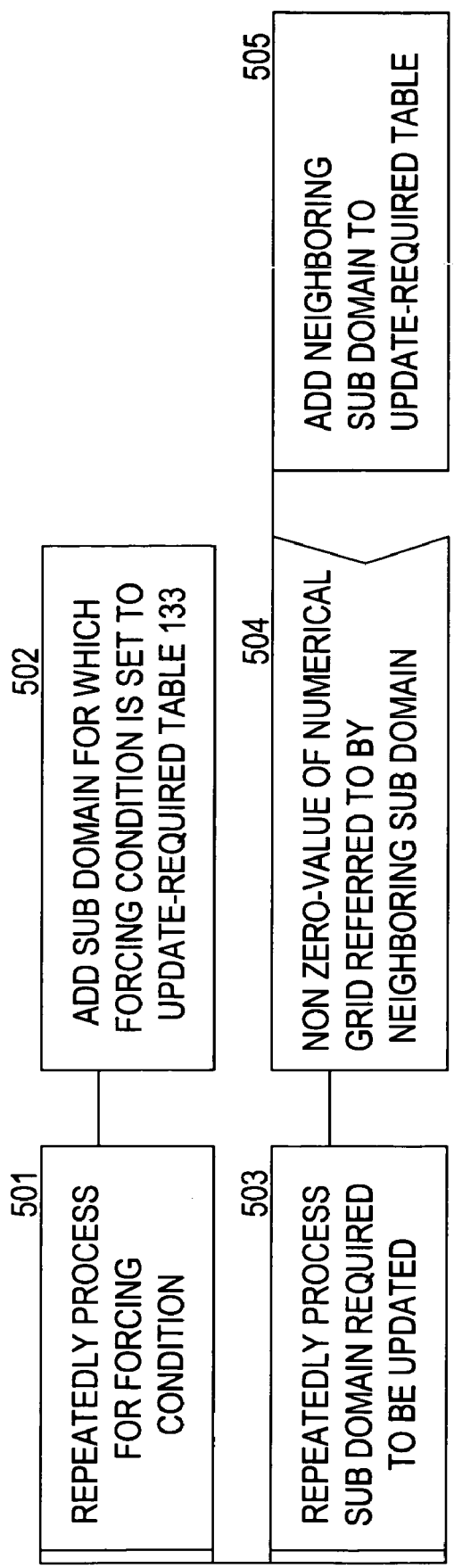
FIG. 5 is a PAD diagram showing a sub-routine of a detection processing of the sub domain required to be updated in step 205 shown in FIG. 2.

FIG. 5 is a PAD diagram showing the details of step 205. Among the steps, the process of occurrence of the flood phenomenon is taken into consideration in steps 501 and 502 shown in FIG. 5 and the process of propagation of the flood phenomenon is taken into consideration in steps 503 to 505 to detect the sub domain required to be updated. Therefore, by a series of steps shown in FIG. 5, it becomes possible to detect the sub domain required to be updated in consideration of a series of processes of occurrence and propagation of the flood phenomenon to the periphery.

In steps 501 and 502, referring to the forcing condition set in step 204 above, an ID of the sub domain, for which the forcing condition is set, is added to the update-required table 133. FIG. 6 is a view showing an example of the content of the update-required table 133. The ID numbers of the sub domains required to be updated are listed in a column 610 in the update-required table 133. It is desirable that the ID numbers be listed without any overlap. Moreover, an acquisition status of the spatial data (already obtained, not obtained yet, and not required) for the sub domain ID is described in a column 620. In step 501, spatial data acquisition statuses (the column 620) in the update-required table 133 are all "already obtained". For the sub domain IDs added in the subsequent steps 502 to 505 described below, spatial data acquisition statuses are all "not obtained yet". The state where the sub domain ID whose spatial data acquisition status is "not obtained yet" is retained up to step 207 described below. By the processing in step 207, the sub domains whose spatial data acquisition statuses are "not obtained yet" are all converted into "already obtained". In step 502, when the sub domain is to be added, the update-required table 133 is confirmed so that the same sub domain ID 610 is not added to the update-required table 133. Through this step, the sub domains, in which the flood phenomenon occurs, can be added to the update-required table 133, following the process of occurrence of the flood phenomenon.

Next, in step 503 shown in FIG. 5, steps 504 and 505 are repeated for the sub domain required to be updated. For the sub domain required to be updated, the column 610 in the update-required table 133 is referred to.

Figure 7:
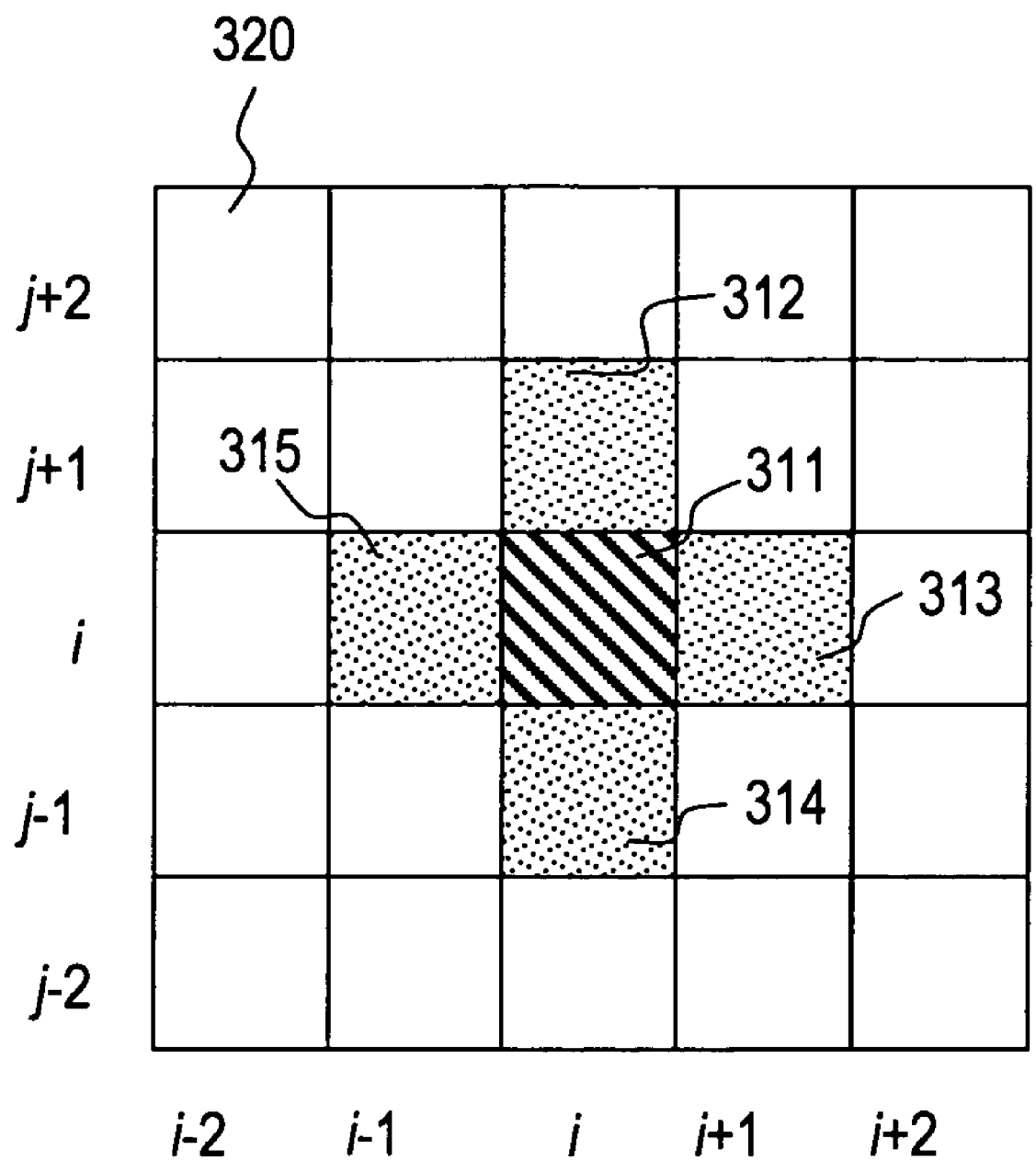
FIG. 7 is an explanatory view for judging the update of the sub domain and showing the relation between a target numerical grid and a neighboring numerical grid.

A method of judging the necessity of update other than that uses the forcing condition will now be described in detail with reference to FIG. 7. FIG. 7 is a diagram showing a method of determining the numerical grid required to be updated, in other words, in which the variable may possibly change, and the numerical grid that is not required to be updated, in other words, in which it is apparent that the variable does not change, from each other.

As described below, in step 208, in the flood simulation according to this embodiment, the variables, for example, the water depth and the current velocity are updated for each time step. It is necessary to allow the judgment of whether or not the flood phenomenon occurs by using the variables. Hereinafter, a value of the variable indicating a state where the flood phenomenon does not occur is referred to as a zero-value, while a value of the variable indicating a state where the flood phenomenon occur is referred to as a non zero-value. For example, the determination of the values used in the flood simulation, such as, the water depth h and the current velocities u and v are zero-values or non zero-values can be made by the following formulae, respectively. When the variables sat isfy the following formulae, the variables are non zero-values. If not, the variables are zero-values.

$$h \geq h0 + he \quad (3\text{-}1)$$

$$u \geq u0 + ue \quad (3\text{-}2)$$

$$v \geq v0 + ve \quad (3\text{-}3)$$

where h0, u0, and v0, are regarded as 0 in the numerical calculation, for example, h0=0 or h0=$10^{-5}$ m may be set. Moreover, he, ue, and ve are the minimum water depth and the current velocities regarded as values different from 0 in the numerical calculation. For example, he=$10^{-4}$ m may be set. When h0, u0, and v0 are not strictly set to 0, it is advantageous because the problem accompanied with an error that is inevitable in the numerical calculation using a computer can be avoided. The formulae are used in the judgments in steps 504 and 209 described below. In each of the steps, the values regarded as 0 and the values set as values different from 0 in the numerical calculation are not required to be the same. For example, he=$10^{-4}$ m may be set in step 504, while he=$10^{-5}$ may be set in step 209. Through such setting, a certain sub domain can be prevented from being frequently switched between the state where the update is required (the state detected in step 504) and the state where the update is not required (the state detected in step 209) to eliminate the processing associated with the switching.

Figure 8:
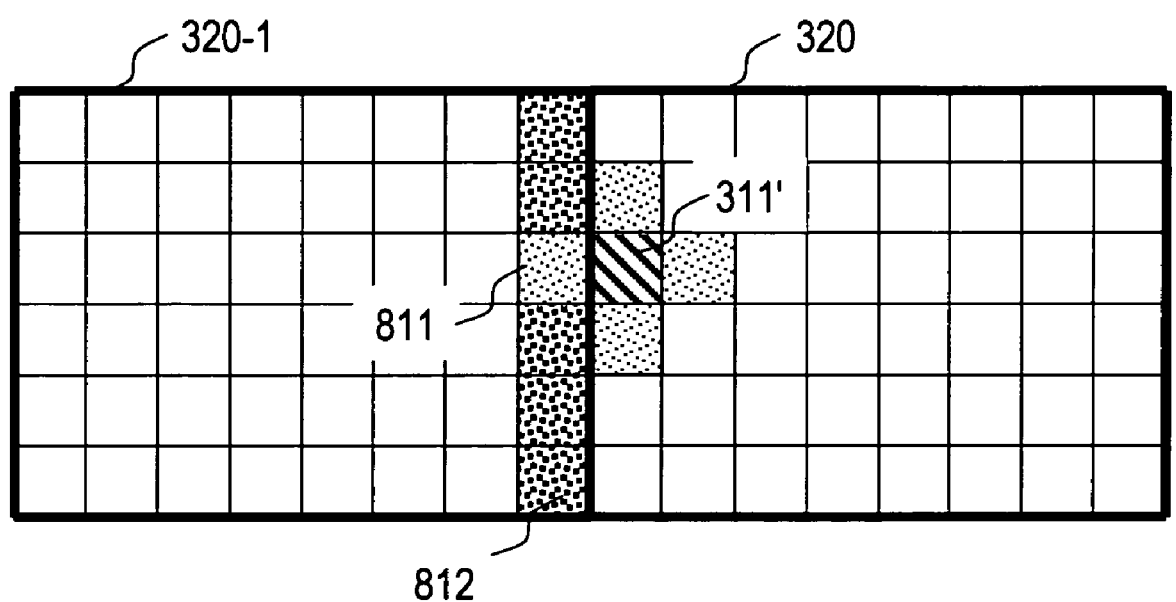
FIG. 8 is an explanatory view for detecting a sub domain to be updated and showing the relation between a target sub domain and a neighboring sub domain.

In FIG. 7, in order to obtain the variables in the next time step in one numerical grid 311, it is necessary to refer to the variables in the current time step in four numerical grids (312 to 315) surrounding the numerical grid 311, which are respectively in contact with four sides of the numerical grid 311. At this time, when the water depths h and the current velocities u and v in the numerical grids 311 to 315 are all zero-values, it is apparent from the numerical model in step 208 that the water depths and the current velocities in the next time step do not change from the zero-values. In this case, the values are not required to be updated. On the contrary, when the water depth or the current velocity in any one of the numerical grid 311 and the numerical grids in contact with four sides of the numerical grid 311 is non zero-value, there is a possibility that the variable in the numerical grid 311 would be a non zero-value in the next time step. In this case, the variable is required to be updated. By the above description, it is understood that the numerical grid required to be updated in the next step is the numerical grid referring to the numerical grid having a non zero-value in the current time step. FIG. 8 is a view showing a method of detecting the sub domain required to be updated. In FIG. 8, a numerical grid 811 included in one sub domain 320-1 is referred to so as to obtain the values of the valuable in the next time step in a numerical grid 311' included in a neighboring sub domain 320. Therefore, when the numerical grid 811 is a non-zero value, there is a possibility that the numerical grid 311' would be a non-zero value in the next time step. The numerical grids 311' and 811 are numerical grids in contact with the boundary between the sub domains 320 and 320-1. Similarly, when any one of numerical grids 812 included in the sub domain 320-1 that is referred to by the sub domain 320 is a non zero-value, there is a possibility that a numerical grid included in the sub domain 320 would be a non zero-value in the next time step.

As described above, in the case where the sub domain 320-1 is required to be updated, when any one of the numerical grids 812 referred to by the sub domain 320 neighboring the sub domain 320-1 is a non zero-value, it is found that the neighboring sub domain 320 is required to be updated in the next time step. When the similar judgment is made for four sides of the sub domain 320-1, the necessity of update for all the sub domains neighboring the sub domain 320-1 can be checked.

As described above, it is understood that, when four sides of each of the sub domains required to be updated are checked in the current time step, all the sub domains required to be updated in the next time step can be detected.

In step 504 shown in FIG. 5, the judgment method described above with reference to FIG. 8 is used to examine whether the numerical grid referred to by the neighboring sub domain is a non zero-value. When the numerical grid is a non zero-value, an ID of the neighboring sub domain is added to the update-required table 133. As in the above-described step 502, prior to the addition of the sub domain ID, the update-required table 133 should be confirmed so as not to add the same sub domain ID to the table. In this manner, by steps 503 to 505 shown in FIG. 5, the sub domain in the vicinity of the sub domain in which the flood phenomenon has already occurred can be added to the update-required table prior to the process of expansion of the flood phenomenon to the periphery.

Returning to the PAD diagram of FIG. 2, the outline of the processing will be described below. In step 206, steps 207 and 208 are repeated for the sub domain required to be updated. For the sub domain required to be updated, it suffices that the update-required table 133 is referred to as in step 503. In step 207, only for the sub domain described in the column 610 in the update-required table 133, with a value in the column 620 being not obtained yet, the spatial data is obtained from the storage location described in the column 430 in the spatial data table 132. The obtained spatial data is expanded in the memory 130.

In step 208, for the sub domain listed in the column 610 in the update-required table 133, the preset numerical model is solved to update the variable in the sub domain required to be updated. First, the forcing condition set in step 204 is reflected into the variable of the corresponding numerical grid. Subsequently, in this embodiment, a two-dimensional unsteady flow model is used to update the water depth and the current velocities to values in the next time step. In the implementation of the two-dimensional unsteady flow model in this embodiment, when the water depth and the current velocities are zero-values in one numerical grid and four numerical grids in contact with four sides of the numerical grid, the water depth and the current velocities of the numerical grid are zero-values in the next time step. Since a specific calculation formula of the numerical model is described in the above-cited "Manual for economic survey of flood control (draft)", the detailed description thereof is herein omitted.

When the PC 100 is, for example, multi-thread compliant or includes a plurality of CPUs 140 or a plurality of CPU cores, parallel processing can increase the processing speed. As a high-efficiency parallel processing when the target area is divided into sub domains, a lot of studies exist in the field called DDM (Domain Decomposition Methods) (for example, see "Domain Decomposition Methods—Algorithms and Theory").

In step 209, the sub domain that is not required to be updated is detected and then is deleted from the update-required table 133. As described above, the sub domain that is not required to be updated is a sub domain in which the flood phenomenon does not occur and to which the flood phenomenon does not propagate from the periphery. In this step 209, the sub domain that is not required to be updated is detected so that only the sub domain required to be updated can be handled in steps 204 to 208 in the next time step. Since an incorrect judgment in step 209 may produce an unexpected result as in step 205, the judgment is extremely important. The method of judgment will be described below.

Figure 15:
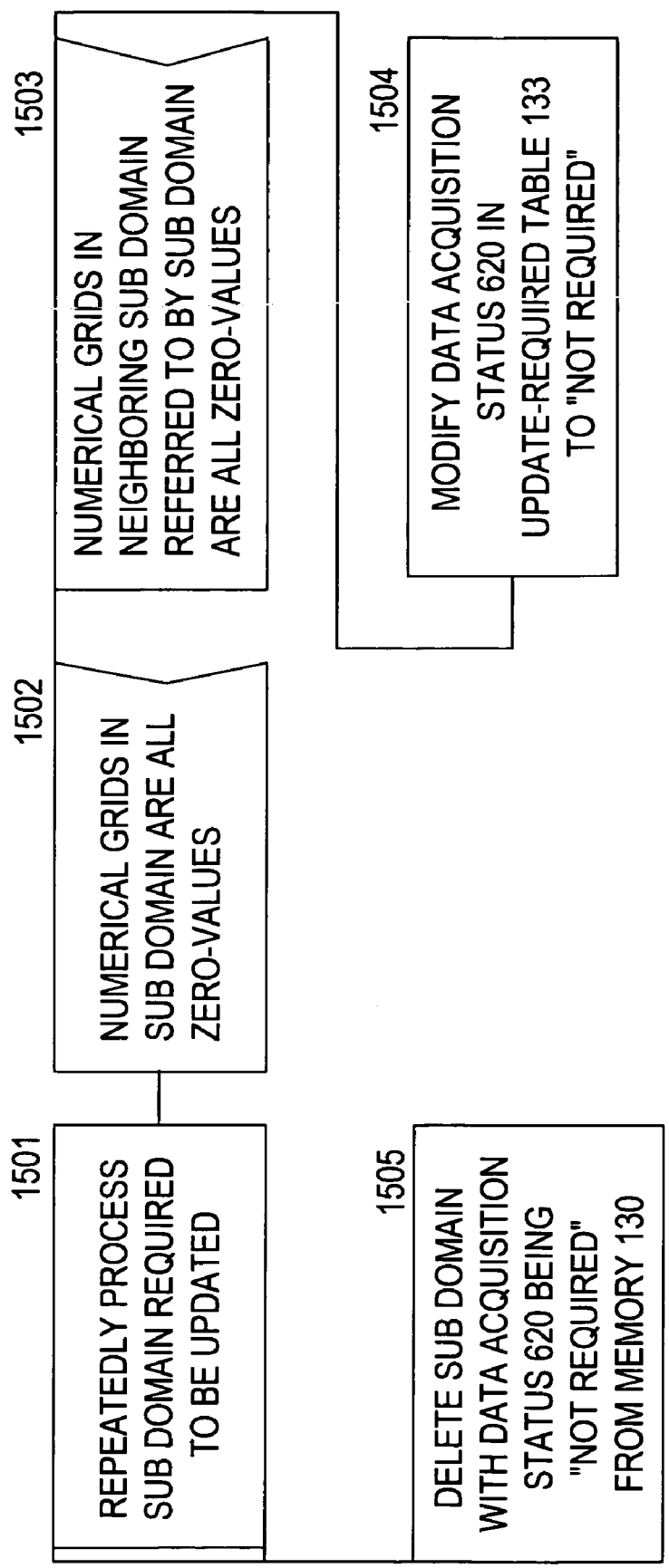
FIG. 15 is a PAD diagram showing the details of step 209.

FIG. 15 is a PAD diagram showing the details of step 209. In step 1501 shown in FIG. 15, steps 1502 to 1504 are repeated for the sub domain required to be updated. For the sub domain required to be updated, the column 610 in the update-required table 133 is referred to as in step 503 shown in FIG. 5. In step 1502, it is judged whether or not all the water depths h and the current velocities u and v in all the numerical grids in the sub domain are zero-values. The zero-values of the respective variables are numerical values that do not satisfy the formulae (3-1) to (3-3). When the result of judgment in step 1502 is true, then in step 1503, it is judged whether or not the variables in all the numerical grids referred to by the sub domain, which are present in sub domains neighboring the sub domain, are all zero values. When the result of judgment in step 1503 is also true as in step 1502, the spatial data acquisition status (the column 620) of the corresponding sub domain in the update-required table 133 is modified to "not required" in step 1504. In the last step 1505 shown in FIG. 15, the spatial data of the sub domain with "not required" being in the column 620 in the update-required table 133 is deleted from the memory 130. The sub domain ID of the sub domain is also deleted from the column 610 in the update-required table 133.

In step 210, the intermediary result of the flood simulation at the current point is output through a GUI (Graphical User Interface) described below to the display 113. As a result, the user can grasp the calculation process. In step 211, the time step dt is added to the elapsed time t from the start of the simulation. The intermediary result of the simulation is stored in the external storage 120 as the simulation result file 122 as needed. A value of the variable in each numerical grid can be stored in the simulation result file 122.

Through the above-described processing, after the target area is divided into a plurality of sub domains, the spatial data is obtained only for the sub domain required to be updated. By using the obtained spatial data and the numerical model, the variables such as the water depth and the current velocity are updated. As a result, the spatial simulation for a large area can be executed at a high speed with a small amount of data.

Figure 9:
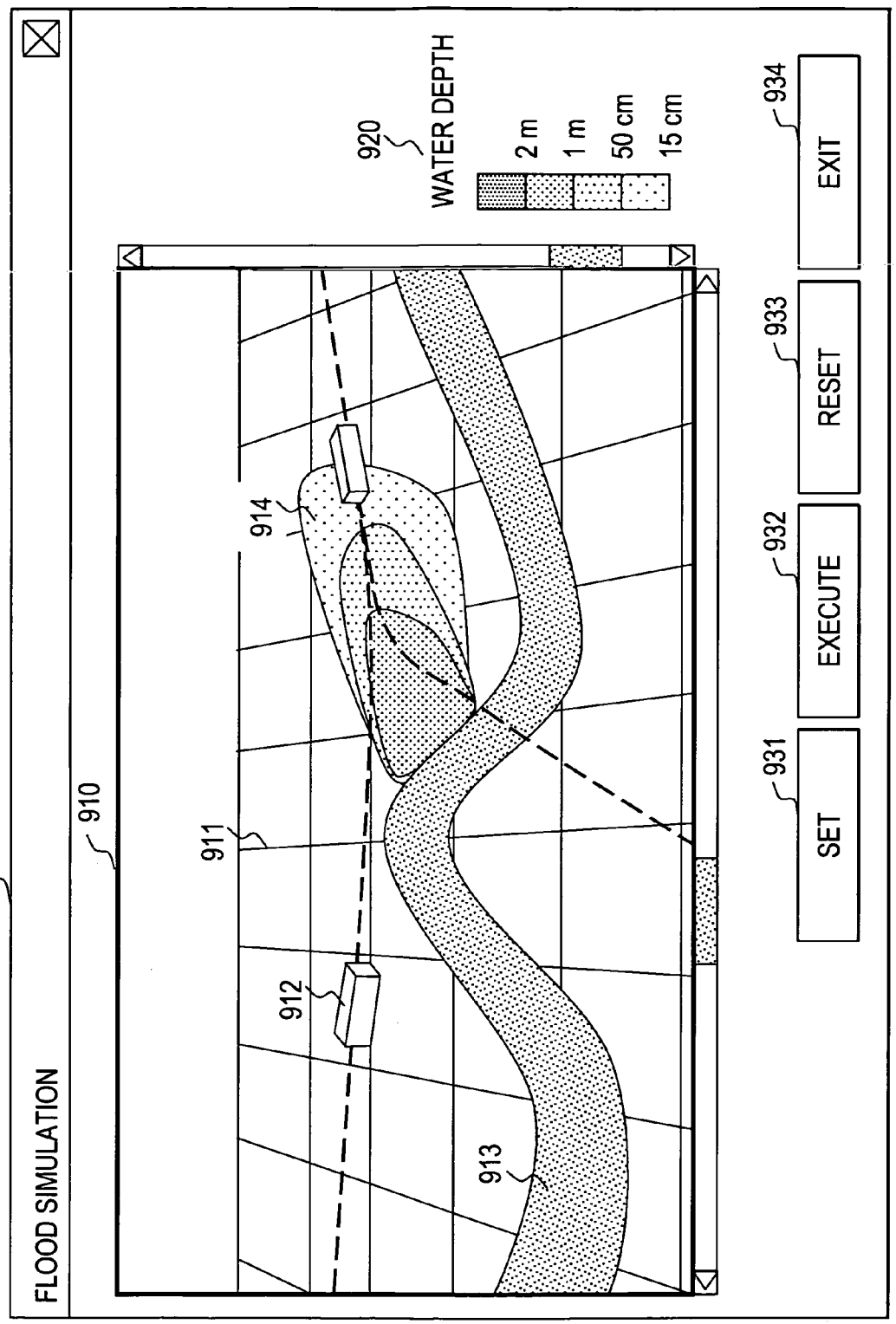
FIG. 9 is a screen image showing an example of a GUI for displaying the result of the flood simulation.

Next, the GUI of the display processing executed in the above-described step 210 will be described with reference to FIG. 9. FIG. 9 is a view showing an example of the GUI (screen) of the flood simulation system. In a window 900 set in a predetermined display area of the display 113, an image 910 three-dimensionally showing the geographic information is displayed. On the image 910, a line for indicating the boundary between the sub domains (for example, as indicated by the reference numeral 911 shown in FIG. 9), a station 912 and a river 913 are displayed. In addition, a water depth 914 corresponding to the result of the flood simulation is also displayed. The water depth 914 is displayed with a pattern or in a color for each water depth level, indicated by a legend 920. In this manner, when each value such as the water depth or the current velocity of the numerical grid, which corresponds to the intermediary result of the simulation, is overlapped with the geographic information and visualized, the user can more easily grasp the result of calculation in a visual sense and therefore such display is desirable. Furthermore, with three-dimensional information of an overhead view of the target area as shown in FIG. 9, the status can be more easily grasped.

The user of the PC 100 operates a cursor on the window 900 and presses down each of a set button 931, a execute button 932, a reset button 933, and an exit button 934 with the mouse 112 to cause the flood simulation system to perform a desired processing.

When the user operates the mouse 112 to press down the set button 931, a dialog 1000 shown in FIG. 10 described below appears at a predetermined display position on the display 113 to interactively realize the above-described step 202 shown in FIG. 2 (the creation of the spatial data table 132).

When the execute button 932 is pressed down, a dialog 1100 shown in FIG. 11 described below appears at a predetermined display position on the display 113 to interactively realize the above-described step 203 shown in FIG. 2. When the reset button 933 is pressed down, the flood simulation program 131 can be put into the state immediately after the initiation of the program. When the exit button 934 is pressed down, the flood simulation program 131 can be terminated.

Figure 10:
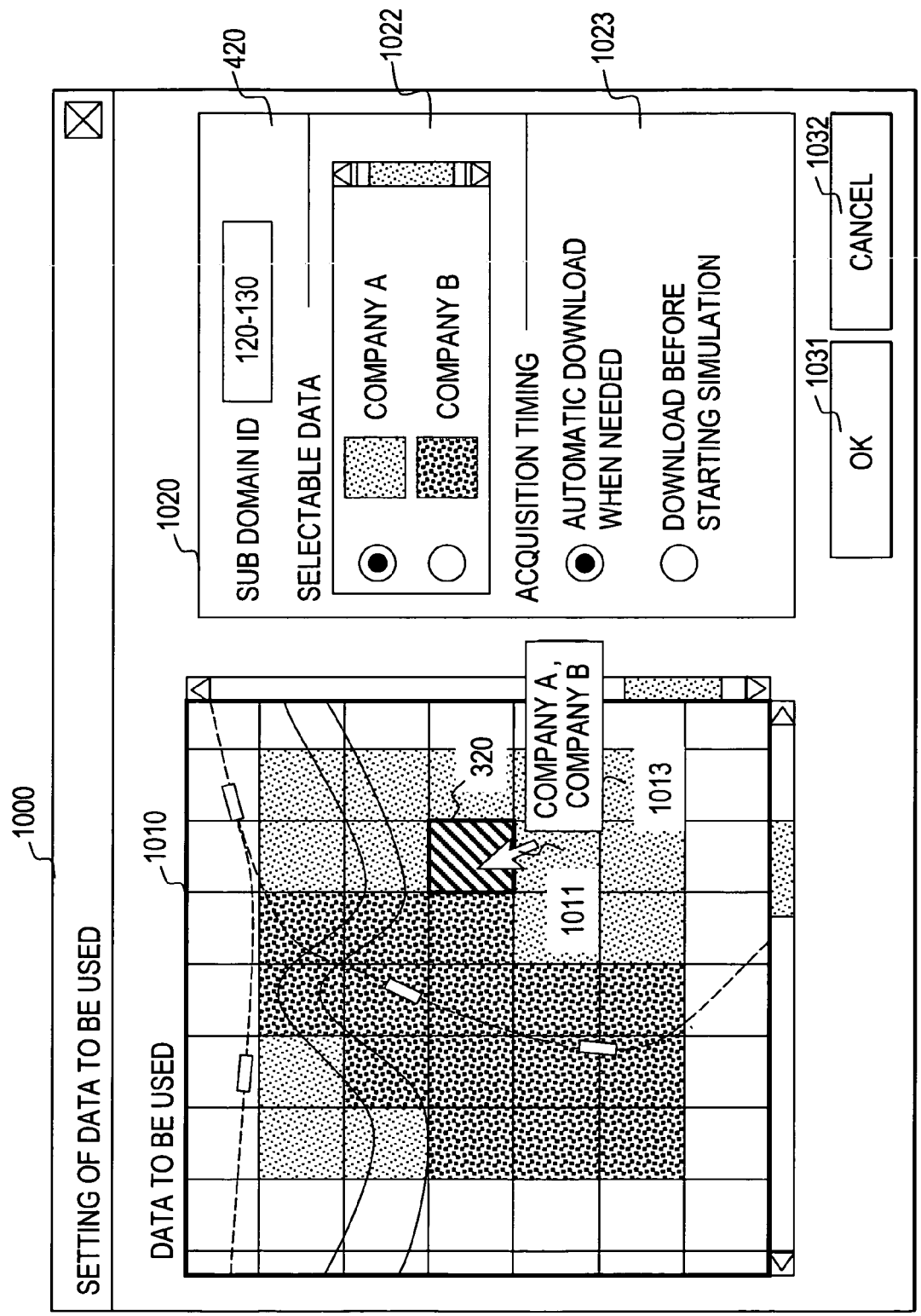
FIG. 10 is a screen image showing an example of a dialog for setting the spatial data table.

Next, FIG. 10 is a view showing an example of the dialog 1000 displayed upon operation of the above-described set button 931 shown in FIG. 9. The dialog 1000 interactively creates the spatial data table 132 to be used.

The dialog 1000 appears by pressing the set button 931 down as described above to interactively realize step 202 in the PAD diagram of FIG. 2 (the creation of the spatial data table 132). When the storage location of the data is complicated, in particular, the presence of the dialog remarkably improves the usability. The dialog 1000 includes geographic information 1010 of the target area and a set information field 1020 for each sub domain ID. When the user uses the mouse 112 to move a mouse pointer 1011, data selectable in the sub domain 320 indicated by the mouse pointer 1011 is displayed as a tool tip (a character displayed when the mouse pointer is placed thereon) 1013. Then, when the user clicks the sub domain 320, set information of the corresponding sub domain 320, that is, an ID 420, the selectable data 1022, and a timing 1023 for obtaining the selectable spatial data (the elevation, the roughness, and the like) are displayed. FIG. 10 shows the case where the user selects "company A" data from "company A" data and "company B" data in the selectable spatial data 1022.

In this manner, the options of the spatial data in one sub domain 320 are presented. As a result, the user can use different data for each purpose. For example, for the flood simulation in the center of an urban area, the user uses high-accuracy and expensive "company A" spatial data. On the other hand, for the flood simulation in the suburbs, low-accuracy and inexpensive "company B" spatial data is used. Furthermore, for example, by providing a dialog 1200 described below, another option "select when needed (not select now)" can be added to the above-described options.

When the selectable spatial data 1022 is stored in a server connected to the network such as the Web server 154, the acquisition timing 1023 can be selected. In FIG. 10, the user selects not "download before the start of simulation" but "automatically download when needed". With this configuration, the spatial data is downloaded from the Web server 154 only when needed so that the user can keep the used spatial data to the minimum necessary. To be more specific, in step 205 shown in FIG. 2, the sub domain is added to the update-required table 133. In step 207, when the acquisition processing of the spatial data is performed, the spatial data is automatically downloaded. As long as the sub domain is not required to be updated, the spatial data of the sub domain is not downloaded. Therefore, when non-free data is used, the cost for purchasing the spatial data can be reduced. On the contrary, the selection of "download before the start of simulation" saves, for example, the user the time of a download processing (step 207) performed during the execution of the flood simulation. As a result, the flood simulation can be executed at a high speed.

The spatial data downloaded from an external server is stored in the spatial data file 121. Once the dialog 1200 described below is provided, it is not always necessary for the user to input the set information of the spatial data table 132 in advance for all the sub domains. When the user presses down an OK button 1031 after appropriately inputting the setting information 1020, the input setting is reflected into the spatial data table 132. On the other hand, when the user presses down a cancel button 1032, the input setting is discarded.

A series of steps of creating the list of the selectable spatial data 1022 when the spatial data stored in the server connected the network such as the GIS server 153 is available will be described. The series of steps can be executed for the sub domain 320 indicated by the mouse pointer 1011 when the user moves the mouse pointer 1011 with the mouse 112.

Figure 14:
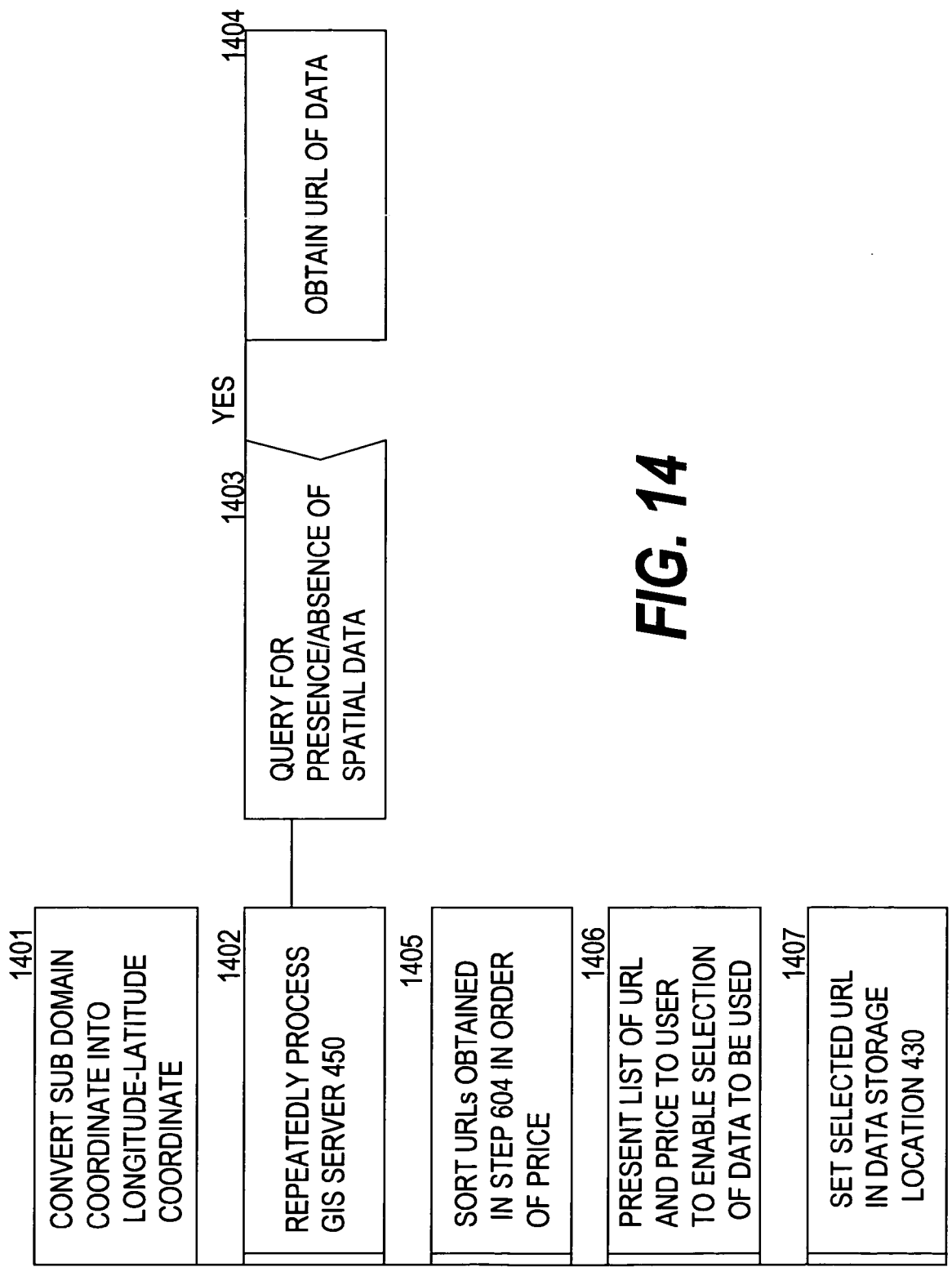
FIG. 14 is a PAD diagram showing a series of steps of creating a list of selectable spatial data 1022.

FIG. 14 is a PAD diagram showing the series of creating the list of the selectable spatial data 1022. In step 1401, all the numerical grid coordinates (i, j) in the sub domain whose spatial data required to be obtained are converted into the longitude-latitude coordinates. In step 1402, the GIS server information table 1300 is read, and the longitude-latitude coordinates are transmitted to the GIS server. In step 1403, a query for the presence or the absence of the corresponding data is made. Then, when the GIS server keeps the spatial data of the corresponding sub domain, the URL of the spatial data is obtained from a provider in step 1404.

In step 1405, the cost information of the GIS server information table 1300 is referred to so as to sort the URLs obtained in step 1404 based on the cost information. This step is not indispensable. However, the sorting of the URLs in the inexpensive order facilitates the user's selection in consideration of the cost.

Then, in step 1406, a GIS server name 1301 after the sorting is displayed as the selectable data 1022 shown in FIG. 10. In step 1407, the storage location of the selected data is stored in a column 430 of the spatial data table 132.

By the above processing, an acquisition target of the spatial data of the corresponding sub domain is determined. At the time designated in the timing 1023 (in step 202 or 207), the spatial data is downloaded.

Figure 11:
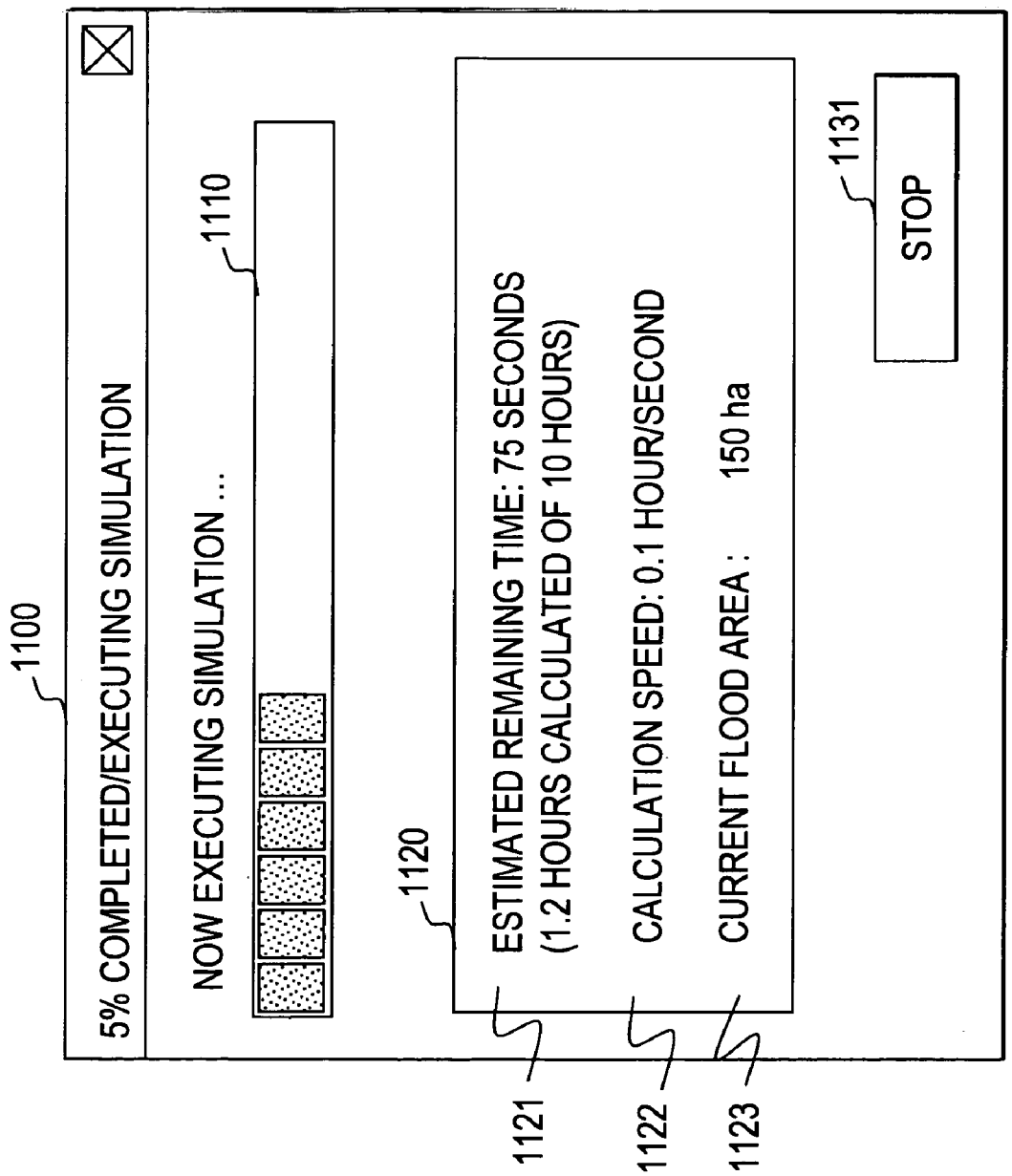
FIG. 11 is a screen image showing an example of the progress of the flood simulation.

FIG. 11 is a view showing an example of a dialog 1100 for notifying the user of the progress during the execution of the flood simulation. The dialog 1100 appears upon pressing down the above-described execute button 932 shown in FIG. 9 so as to notify the user of the progress in step 203 in the PAD diagram of FIG. 2.

The dialog 1100 includes a progress bar 1110 indicating the progress of the flood simulation and an information field 1120 for an execution status of the program.

The information field 1120 contains an estimated remaining time 1121 to the completion of the flood simulation, the current calculation speed 1122, and a flood area 1123 at current time. The estimated remaining time 1121 contains, for example, as is illustrated, information "1.2 hours calculated of 10 hours", in other words, the total time length T (second) of the simulation and the elapsed time t (second) from the start of the simulation to the current time to allow a more detailed display of the progress of the flood simulation. In this case, the value T handled in step 203 is referred to as the total time length T of the simulation, while the value t handled in step 211 is referred to as the elapsed time t from the start of the simulation. The calculation speed 1122 indicates how many hours in the simulation correspond to one second in the real world. For example, in FIG. 11, one second in the real world corresponds to 0.1 hour in the simulation. This numerical value can also be calculated as follows. The time in the real world in step 211 is obtained and then a difference between the obtained time and the time in the previous step 211 is obtained to measure the time in the real world required for one repeat processing. The time step dt is divided by the measured time to obtain the numerical value. In this invention, since the calculation speed of the simulation varies depending on the number of sub domains to be updated, the display of the calculation speed 1122 allows the user to more easily estimate the progress of the simulation.

The progress bar 1110 allows the user to visually grasp the estimated remaining time 1121. Moreover, since the calculation speed varies depending on the number of sub domains to be updated as described above, the display of the current calculation speed 1122 or the flood area 1123 associated with the number of sub domains to be updated allows the user to determine whether to wait for the end of the processing or to interrupt the processing to perform another operation. When the processing is interrupted, the user presses down the stop button 1131 to end step 203.

Figure 12:
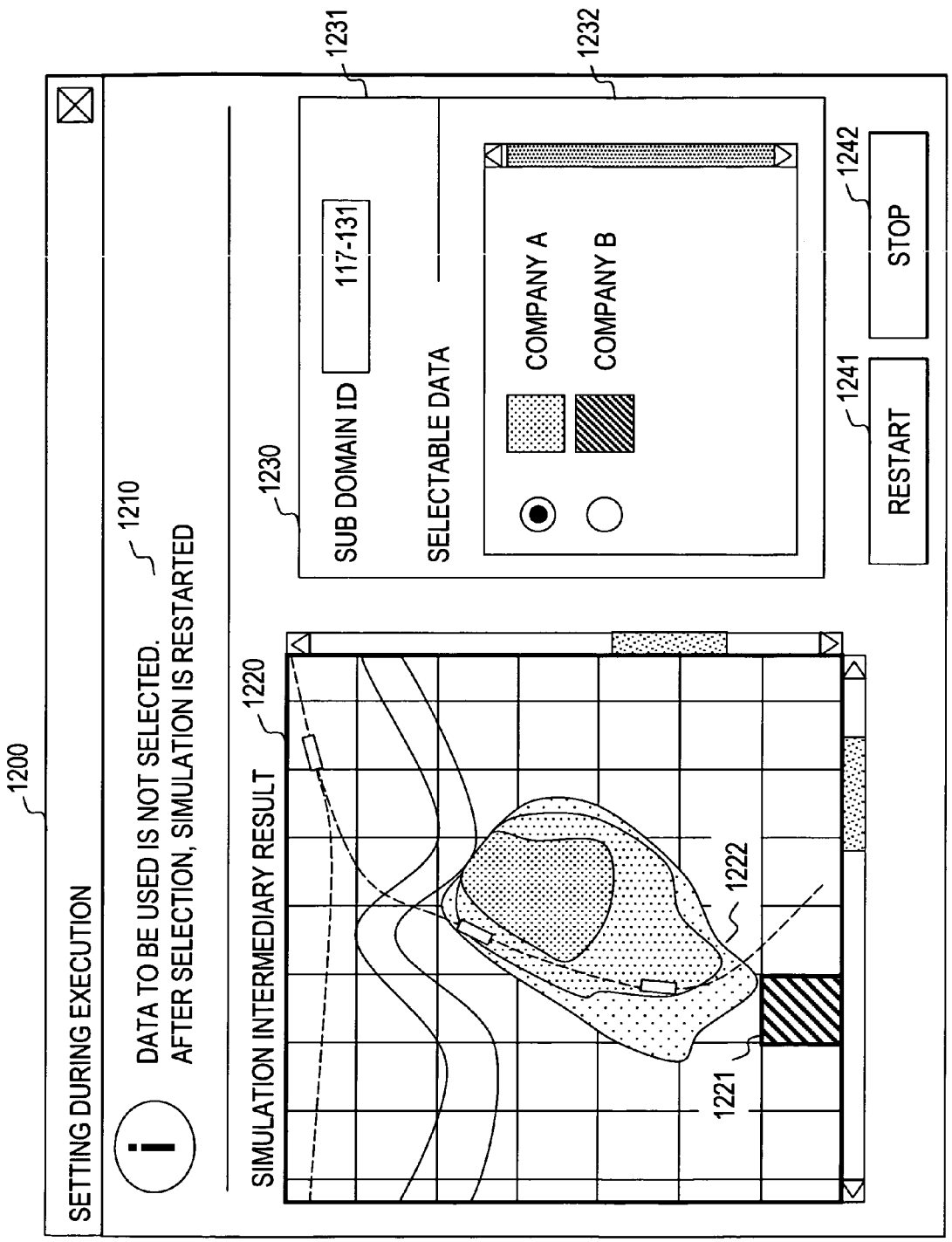
FIG. 12 is a screen image showing an example of a dialog for adding a record to the spatial data table.

FIG. 12 is a view showing an example of the dialog for interactively selecting the spatial data table 132 used during the execution of the flood simulation.

The dialog 1200 appears when the spatial data is to be obtained in step 207 for the sub domain for which the spatial data table 132 is not set. On the dialog 1200, a message 1210 indicating that the spatial data table 132 is not set, geographic information 1220 including the sub domain 1221 required to be set, and a set information field 1230 for the sub domain 1221 are displayed.

FIG. 12 shows a moment the top of a flood area 1222 reaches the sub domain 1221 for which the spatial data table 132 is not set. In the set information field 1230, an ID 1231 of the sub domain 1221 and selectable data 1232 are displayed. FIG. 12 shows the case where "company A" data is selected. After completing the setting, the user can select to restart step 207 by pressing a restart button 1241 down or to end step 203 by pressing a stop button 1242 down to return to the window 900 shown in FIG. 9.

The numerical model expected to be executed at a high speed with a small amount of data through the application of this invention is a numerical model satisfying the following conditions (a) and (b).

(a) The presence of a numerical grid whose variables are not required to be updated.
(b) The tendency of spatially continuous distribution of the state of the numerical grids.

The numerical model satisfying the above-mentioned conditions (a) and (b) is present in the field of simulating, for example, a flood, a flame propagation, a traffic flow, the epidemic of an infectious disease, and the like in one area. To be more specific, a two-dimensional unsteady flow model and a tank model serving as numerical models for performing the flood simulation, a numerical model for performing the flame propagation simulation are cited as examples of such numerical models. For this type of numerical model; for example, Keiro Muro, Eiichi Ito, Kazuaki Iwamura; Spatial simulation using 3-dimensional urban data and its application to the prediction of spreading fire, IPSJ-MPS, Vol. 1997, No. 113, 1997 is known. Even when the spatial simulation is a flame propagation simulation, the judgment condition corresponding to step 209 shown in FIG. 2 above is the same as the above-described condition. To be specific, the judgment condition is satisfied by the sub domain in which ignition does not occurs and a flame does not propagate from the periphery. As in the case of the sub domain in which neither ignition nor propagation occurs yet, however, the sub domain that is completely burned out so as not to leave a combustible material therein also satisfy the above judgment condition.

In the above embodiment, the program for performing the spatial simulation in the PC 100 has been described. The present invention is also applicable to a program for performing the spatial simulation in a parallel computer in place of the PC. Even in this case, the amount of data to be actually calculated in the target area can be remarkably reduced as in the case of the program executed in the PC. Therefore, the calculation speed can be improved to realize a larger-scale spatial simulation within a short period of time. The high-efficiency parallelization is still an important objective to be achieved in the parallel computer. For this objective, the result of studies in the field of DDM described above can be applied.

Figure 16:
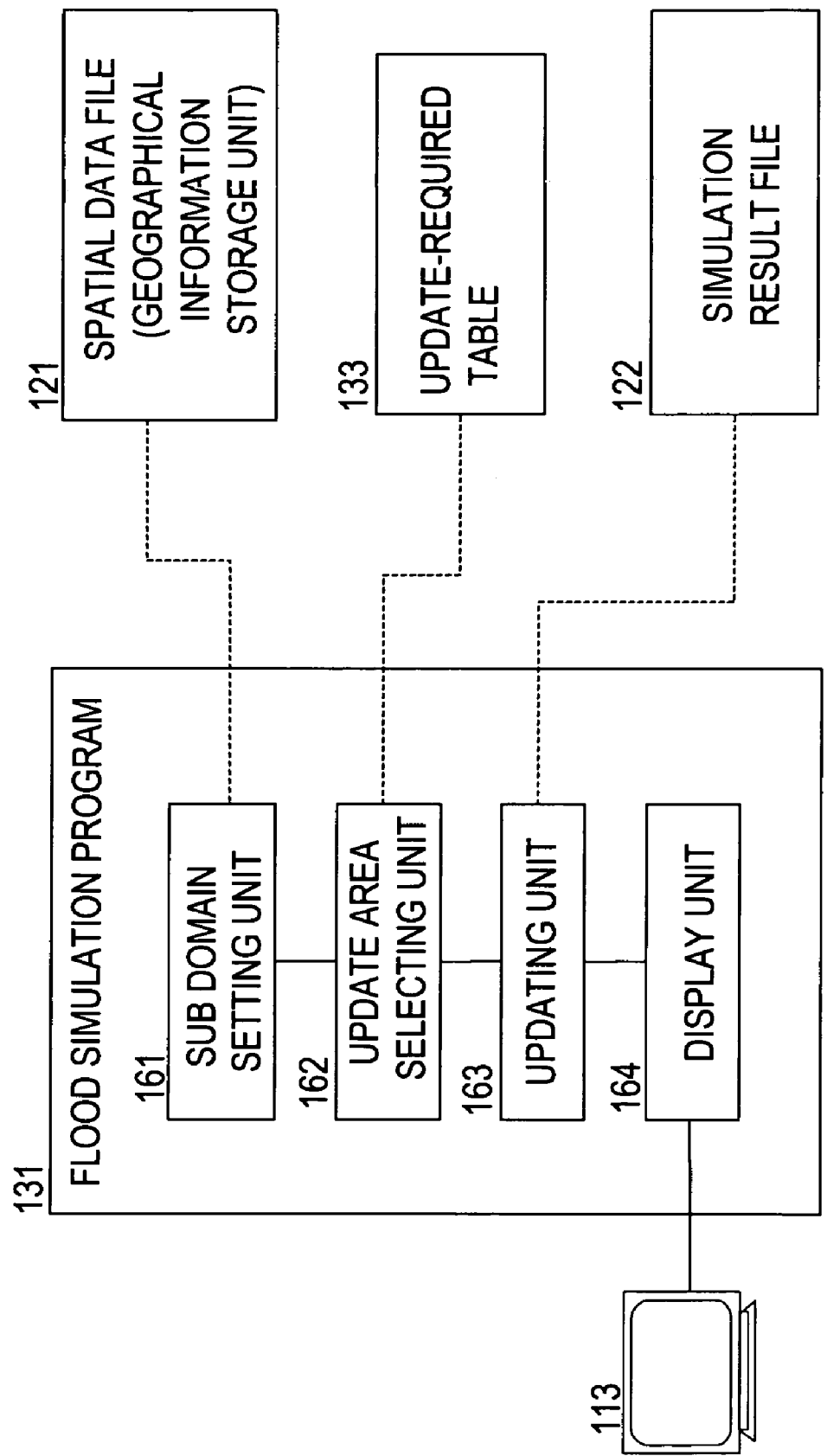
FIG. 16 is a block diagram showing functional elements of a flood simulation program 131.

FIG. 16 is a block diagram showing functional elements of the flood simulation program 131.

The flood simulation program 131 includes a geographic information storage unit (the spatial data file 121) for storing geographic information (spatial data), a sub domain setting unit 161 for dividing the area storing the geographic information into a plurality of sub domains, each including numerical grids, an update area selecting unit 162 for selecting the sub domain required to be updated, an updating unit 163 for setting a forcing condition for the selected sub domain and simulating and updating the variables in the numerical grid contained in the selected sub domain by using the external force, and a display unit 164 for outputting the updated value of the variable to the display 113 (display device).

In this invention, when the variable in one numerical grid indicates the occurrence of a phenomenon to be a target of the spatial simulation, the procedure of selecting only the sub domain required to be updated includes a procedure of selecting the sub domain containing the numerical grid as a sub domain required to be updated.

Moreover, when the variable having a value indicating the occurrence of the phenomenon to be a target of the spatial simulation is referred to so as to update the variable in the numerical grid, the procedure of selecting only the sub domain required to be updated includes a procedure of selecting the sub domain containing the numerical grid as the sub domain required to be updated.

When all the variable in all the numerical grids constituting one sub domain do not indicate the occurrence of the phenomenon to be a target of the spatial simulation, and in addition, all the variables in the all the numerical grids referred to so as to update the variables in the numerical grids do not indicate the occurrence of the phenomenon to be a target of the spatial simulation, the procedure of selecting only the sub domain required to be updated includes a procedure of not selecting the sub domain as the sub domain required to be updated.

In this manner, in the procedure of selecting the sub domain required to be updated, the calculation cost for update of the variables can be reduced by the above-described three methods.

In the above-described procedure of selecting only the sub domain required to be updated, when the variable in one numerical grid indicates the occurrence of a phenomenon to be a target of the spatial simulation, the sub domain including the numerical grid is selected. As a result, with the process of occurrence of the phenomenon, the number of sub domains to be updated can be increased or reduced.

Furthermore, in the above-described procedure of selecting only the sub domain required to be updated, when the variable indicating the occurrence of a phenomenon to be a target of the spatial simulation is referred to so as to update the variable in one numerical grid, the sub domain including the numerical grid is selected as the sub domain required to be updated. As a result, prior to the process of expanding the area in which the phenomenon occurs, the number of sub domains to be updated can be increased or reduced.

Furthermore, in the above-described procedure of selecting only the sub domain required to be updated, when all the variable in all the numerical grids constituting one sub domain do not indicate the occurrence of the phenomenon to be a target of the spatial simulation, and in addition, all the variables in the all the numerical grids referred to so as to update the variables in the numerical grids do not indicate the occurrence of the phenomenon to be a target of the spatial simulation, the sub domain is not selected as the sub domain required to be updated. As a result, with the process of decreasing the area in which the phenomenon occurs, the number of sub domains to be updated can be reduced.

As described above, according to this invention, the spatial simulation for a large area can be realized in a PC or the like so as to be applicable to the spatial simulation for a flood, flame propagation, a traffic, the epidemic of an infectious diseases, and the like.

While the present invention has been described in detail and pictorially in the accompanying drawings, the present invention is not limited to such detail but covers various obvious modifications and equivalent arrangements, which fall within the purview of the appended claims.

What is claimed is:

1. A computer readable medium recorded with a spatial simulation program for controlling a computer to reproduce a time-based change of a phenomenon represented by a variable in a space represented by the plurality of numerical grids, comprising:

defining plural sub domains, wherein a plurality of numerical grids neighboring each other constitute each sub-domain, and wherein each numerical grid of the numerical grids holds one or more variables to represent the phenomenon within the numerical grid, and the numerical grid is initialized with spatial data;

setting a condition for updating the one or more variables associated with a subject numerical grid, and registering identification of subject sub-domains including the subject numerical grid, into an update-required table;

detecting sub domains including at least one numerical grid in which any value of the one or more variables changes with time, by checking, for subject sub-domains registered in the update-required table, whether a first numerical grid included in a first sub-domain registered in the update-required table, is needed to be referred to when a numerical model updates the one or more variables associated with a second numerical grid included in a second sub-domain which is not registered in the update-required table, wherein the numerical model includes equations which change values of the one or more variables associated with a handled numerical grid by referring to the variables associated with the handled numerical grid and its neighboring numerical grids, and the first numerical grid is needed to be undated based on a judgment condition which includes equations which return a value indicating whether the first numerical grid is needed to be undated based on the variables of the first numerical grid, and registering identification of the second sub-domain into the update-required table;

updating the one or more variables in the numerical grids constituting the detected sub domains, by applying the numerical model for the numerical grids in the sub-domains registered in the update-required table; and outputting values of the one or more variables of the numerical grids in the sub-domains registered in the update-required table, onward to memory.

2. A method of a spatial simulation carried out by a computing system, for use in simulating a target phenomenon in a space, comprising:
   (a) defining two or more sub-domains, wherein two or more numerical grids neighboring each other constitute each sub-domain, and wherein each numerical grid of the numerical grids holds one or more variables to represent the phenomenon within the numerical grid, and the numerical grid is initialized with spatial data;
   (b) inputting conditions for updating the one or more variables associated with a subject numerical grid, and registering identification of subject sub-domains including the subject numerical grid, into an update-required table;
   (c) checking, for subject sub-domains registered in the update-required table, whether a first numerical grid included in a first sub-domain registered in the update-required table, is needed to be referred to when a numerical model updates the one or more variables associated with a second numerical grid included in a second sub-domain which is not registered in the update-required table, wherein the numerical model includes equations which change values of the one or more variables associated with a handled numerical grid by referring to the variables associated with the handled numerical grid and its neighboring numerical grids, and the first numerical grid is needed to be updated based on a judgment condition which includes equations which return a value indicating whether the first numerical grid is needed to be updated based on the variables of the first numerical grid, and registering identification of the second sub-domain into the update-required table;
   (d) updating the one or more variables by applying the numerical model for the numerical grids in the sub-domains registered in the update-required table; and
   (e) outputting values of the one or more variables of the numerical grids in the sub-domains registered in the update-required table, onward to memory.

3. The method of claim 2, wherein operations (b) through (e) are repeated.

4. The method of claim 3, wherein the method comprises:
   deleting identifications of sub-domains from the update-requested table if all the numerical grids in the sub-domain, and all the numerical grids needed to be referred to when the numerical model updates the one or more variables associated with the numerical grids in the sub-domain, are not needed to be updated based on the judgment condition.

5. The method of claim 2, wherein the method comprises:
   presetting a location of the spatial data for the one or more variables for each sub-domain;
   presetting an acquisition timing of the spatial data for the one or more variables for said each sub-domain;
   obtaining the spatial data from the location before the simulation, if the acquisition timing instructs to obtain data before the simulation; and
   obtaining the spatial data from the location when the data is needed, if the acquisition timing instructs to obtain data when needed.

6. The method of claim 5, wherein the obtaining of the spatial data comprises:
   requesting a server connected through a network to download the data from the server.

7. The method of claim 2, wherein the numerical model is a spatial simulation model for updating a water depth of a target area for each time increment, and water depth values in the numerical grids are updated as the one or more variables.

8. The method of claim 2, wherein operation (e) includes:
   displaying geographical information of an area containing the numerical grids in which the one or more variables are to be updated, as a three-dimensional image, on a display device;
   displaying the two or more sub-domains on the geographical information in the three-dimensional image; and
   displaying a time-based change of the one or more variables, on the display device.

9. A computer readable medium recorded with a spatial simulation program for controlling a computer to execute procedures for use in simulating a target phenomenon in a space, the spatial simulation program causing the computer to effect operations comprising:
   (a) defining two or more sub-domains, wherein two or more numerical grids neighboring each other constitute each sub-domain, and wherein each numerical grid of the numerical grids holds one or more variables to represent the phenomenon within the numerical grid, and the numerical grid is initialized with spatial data;
   (b) inputting conditions for updating the one or more variables associated with a subject numerical grid, and registering identification of subject sub-domains including the subject numerical grid, into an update-required table;
   (c) checking, for subject sub-domains registered in the update-required table, whether a first numerical grid included in a first sub-domain registered in the update-required table, is needed to be referred to when a numerical model updates the one or more variables associated with a second numerical grid included in a second sub-domain which is not registered in the update-required table, wherein the numerical model includes equations which change values of the one or more variables associated with a handled numerical grid by referring to the variables associated with the handled numerical grid and its neighboring numerical grids, and the first numerical grid is needed to be updated based on a judgment condition which includes equations which return a value indicating whether the first numerical grid is needed to be updated based on the variables of the first numerical grid, and registering identification of the second sub-domain into the update-required table;
   (d) updating the one or more variables by applying the numerical model for the numerical grids in the sub-domains registered in the update-required table; and
   (e) outputting values of the one or more variables of the numerical grids in the sub-domains registered in the update-required table, onward to memory.

* * * * *